US006309502B1

(12) United States Patent
Hiroshige et al.

(10) Patent No.: US 6,309,502 B1
(45) Date of Patent: Oct. 30, 2001

(54) CONDUCTIVE EPOXY RESIN COMPOSITIONS, ANISOTROPICALLY CONDUCTIVE ADHESIVE FILMS AND ELECTRICAL CONNECTING METHODS

(75) Inventors: Yuji Hiroshige, Tokyo; Koji Ito, Ebina, both of (JP)

(73) Assignee: 3M Innovative Properties Company, St. Paul, MN (US)

( * ) Notice: Subject to any disclaimer, the term of this patent is extended or adjusted under 35 U.S.C. 154(b) by 0 days.

(21) Appl. No.: 09/446,928

(22) PCT Filed: Aug. 18, 1998

(86) PCT No.: PCT/US98/17086

§ 371 Date: Dec. 29, 1999

§ 102(e) Date: Dec. 29, 1999

(87) PCT Pub. No.: WO99/09101

PCT Pub. Date: Feb. 25, 1999

(30) Foreign Application Priority Data

Aug. 19, 1997 (JP) .................................... 9/222747
Sep. 29, 1997 (JP) .................................... 9/264287

(51) Int. Cl.[7] ............................ C08G 59/100; C09J 9/02; H05K 3/30
(52) U.S. Cl. ...................... 156/273.3; 522/109; 522/111; 522/170; 522/181; 428/546; 428/220; 428/355 EP; 428/356; 252/519.33; 156/275.7; 156/307.7; 156/33; 29/832; 257/783
(58) Field of Search ............................ 156/273.3, 275.5, 156/275.7, 307.1, 307.7, 330; 522/31, 66, 100, 109, 111, 170, 181; 428/546, 220, 323, 343, 345, 356, 355 EP, 407; 252/512, 519.3, 519.33; 29/832; 257/778, 783

(56) References Cited

U.S. PATENT DOCUMENTS 4,916,805 * 4/1990 Ellrich et al. .................. 156/273.3
5,115,019 5/1992 Marx et al. ........................... 525/65
5,362,421 11/1994 Kropp et al. ......................... 252/512
5,726,216 * 3/1998 Janke et al. .......................... 522/31

FOREIGN PATENT DOCUMENTS

| 0 094915 | 1/1987 | (EP) . |
| 49-25039 | 4/1972 | (JP) . |
| 4-91183 | 3/1992 | (JP) . |
| 4-189883 | 7/1992 | (JP) . |
| 4-370137 | 12/1992 | (JP) . |
| 5-32799 | 2/1993 | (JP) . |
| 7-90237 | 4/1995 | (JP) . |
| 7-166145 | 6/1995 | (JP) . |
| 7-197000 | 8/1995 | (JP) . |
| 8-20629 | 1/1996 | (JP) . |
| 8-111124 | 4/1996 | (JP) . |
| WO 96/19510 | 6/1996 | (WO) . |

OTHER PUBLICATIONS

H.J. Hageman, Progress in Organic Coatings, 13, 123–150 (1985).

* cited by examiner

Primary Examiner—Jeff H. Aftergut
Assistant Examiner—Michael A. Tolin
(74) Attorney, Agent, or Firm—Doreen S. L. Gwin

(57) ABSTRACT

To produce a conductive epoxy resin composition with improvement in the characteristics of rapid-curability, heat resistance and moisture resistance, adhesion reliability, storage properties and low-temperature curability that can be used effectively for production of conductive adhesive films. The conductive epoxy resin composition comprises an alicyclic epoxy resin, optional diols, a styrenic thermoplastic elastomer with an epoxy group in the molecule, an ultraviolet activated cationic polymerization catalyst, an optional tackifier having an aromatic ring in the molecule, and conductive particles.

15 Claims, No Drawings

CONDUCTIVE EPOXY RESIN COMPOSITIONS, ANISOTROPICALLY CONDUCTIVE ADHESIVE FILMS AND ELECTRICAL CONNECTING METHODS

BACKGROUND OF THE INVENTION

1. Field of the Invention

The present invention relates to epoxy resin compositions suitable for forming anisotropically conductive adhesive films, to anisotropically conductive adhesive films formed from the epoxy resin compositions, and to an electrical connecting method between conductors using the anisotropically conductive adhesive films.

2. Description of the Related Art

A variety of conventional epoxy resin compositions are well-known, and many efforts have been made toward improving their characteristics.

For example, styrenic thermoplastic elastomers (hereinafter referred to as "styrenic elastomers") are added to improve the impact resistance of epoxy resin compositions. Addition of styrenic elastomers can improve the impact resistance of epoxy resins across a wide temperature range, alleviate residual internal stress caused by the curing reaction, and improve the adhesion reliability. Such epoxy resin and styrenic elastomer compositions are disclosed, for example, in Japanese Unexamined Patent Publication (Kokai) No. 8-20629, No. 7-166145, No. 4-370137 and No. 49-20 25039. However, since the compositions disclosed in these publications do not involve reaction between the styrenic elastomer and epoxy resin, the cured compositions have low heat resistance and moisture resistance, and thus insufficient adhesion reliability. Also, since epoxy resins and styrenic elastomers normally have low compatibility, there are limitations to the mixing ratio if a uniform composition is desired.

In addition, Japanese Unexamined Patent Publication (Kokai) No. 7-197000, No. 4-224818 and No. 4-91183 disclose curing compositions containing epoxy resins and acid-modified styrenic elastomers which can react with those resins. The use of acid-modified styrenic elastomers in these curing compositions provides improved compatibility between the styrenic elastomer and the epoxy resin. Nevertheless, progressive reaction between the acidic functional groups and epoxy resin during storage of these compositions tends to shorten their usable life. The curing agents included in these compositions cause crosslinking by polyaddition reaction, the reaction temperature is at least 150° C. and the reaction time is relatively long, at a half hour or more. They are therefore unsuitable as adhesive materials to be used in the fields of electricity or electronics, which require high-speed curing, or curing within a very short time (for example, within 1 minute).

An epoxy resin composition comprising an epoxy resin and a reactive styrenic elastomer, which is used to form an anisotropically conductive adhesive film (hereinafter referred to as "conductive adhesive film") is disclosed in Japanese Unexamined Patent Publication (Kokai) No. 5-32799 (Sumitomo Bakelite Co.), which uses a microencapsulated imidazole derivative as a curing agent. This conductive adhesive film provides sufficiently strong adhesion between microcircuit boards such as FPCs (flexible printed circuits), while establishing electrically continuous connections between conductors such as connecting terminals on mutually facing substrates without shorting out the circuits. Such conductive adhesive films are formed by dispersing conductive particles in an insulating adhesive such as an epoxy resin and forming a film. Connections between conductors are usually established with the conductive adhesive film in the following fashion. After inserting the adhesive film between the two substrates, pressure and heat are applied to complete the adhesion. Thus, since the adhesion is achieved between the mutually facing connecting terminals with the conductive particles in an electrically continuous state along the direction of thickness of the film (usually called the "Z-axis direction"), continuity is established between the facing connecting terminals.

However, in order to meet recent demands for improved productivity, it has been necessary to complete adhesion with a very short adhesion time, specifically by thermal contact bonding for 10–30 seconds. As one means of meeting this demand it has been proposed to use microencapsulated imidazole derivatives as curing agents, as in Japanese Unexamined Patent Publication (Kokai) No. 5-32799 above. This presents the risk of capsule rupture due to thermal and mechanical factors during the production process, and therefore this proposal is not advantageous from a production standpoint.

Thus, conventional conductive adhesive films using epoxy resins and styrenic elastomers have not been able to provide improvement in all the performance parameters of speed-curing, heat and moisture resistance and adhesion reliability.

Addition of cationic polymerization initiator catalysts has also been considered for application to high-speed curable epoxy resin adhesives. Lewis acids and their coordinated compounds can generally be used as cationic polymerization initiator catalysts, and therefore higher reactivity and higher speed curing can be achieved by their combination with alicyclic epoxy resins than with glycidyl ether-type epoxy resins. However, combinations of alicyclic epoxy resins and common cationic polymerization initiator catalysts have not been practical because of their short usable life.

Attention has therefore turned to "ultraviolet active cationic polymerization catalysts" (hereinafter referred to as "UV catalysts"), which have low catalytic activity in the absence of ultraviolet irradiation but increase their activity as catalysts upon ultraviolet irradiation. That is, it has been suggested that better storage stability (longer usable life) can be achieved by using such UV catalysts. Documents dealing with UV catalysts include H. J. Hageman, Progr. Org. Coat. 13, 123 (1985), and European Patent Application No. 0094915 (1984).

Also, U.S. Pat. No. 5,362,421 (corresponding to Japanese National Publication (Kohyo) No. 8-511570) discloses acceleration of epoxy resin curing reactions by cationic polymerization reaction using alcohols, including diols. However, to date, no epoxy resin composition has been provided which includes a combination of an alicyclic epoxy resin and a UV catalyst and has sufficient impact resistance.

Another approach for providing conductive adhesive films is to improve the low temperature curability (allow curing at low temperature). In recent years, plastic base liquid crystal displays (LCDs), and flexible printed circuits (FPCs) using polyethylene terephthalate (PET) films as base materials have been developed in order to lower costs and decrease the weight of liquid crystal (LCD) panels. Consequently, establishing these connections at contact bonding temperatures for known conductive adhesive films (150–200° C.) results in thermal damage to the LCDs and FPCs. In addition, the high flexibility of FPCs is not able to alleviate the stress produced by the difference in heat expansion between the mutually adhered circuit boards, contact bonding at high temperatures causes large deformation of the film base materials and creates "wrinkles" on the FPCs. This stress alleviation problem also needs to be solved with connections between the glass panels of the LCDs and the FPCs employing polyimide film base materials. From this standpoint, a contact bonding temperature of 120° C. or below is usually required.

Examples of conductive adhesive films which can be cured at low temperature are disclosed in Japanese Unexamined Patent Publications (Kokai) No. 4-189883 and No. 7-90237. Both of the conductive adhesive films disclosed in these publications have improved curing agents for the epoxy resins, and have peak activation temperatures near 100° C., as measured using a DSC (differential scanning calorimeter), with a temperature elevating rate of 10° C./min. When adhesion is actually carried out in a relatively short time at a contact bonding temperature of 120° C. or below, the peak activation temperature must be less than 100° C. in order to achieve sufficient adhesion reliability. Also, since the highly reactive curing agent is in admixture with the epoxy resin during storage, there is also a risk of reduced storage stability.

Japanese Unexamined Patent Publication (Kokai) No. 8-111124 discloses a conductive adhesive film with a 3-layered structure of a thermosetting resin layer, a separating layer and a curing agent layer. This conductive adhesive film has the highly reactive curing agent separated from the thermosetting resin, thus achieving excellent storage stability while also providing a peel strength of 1000 g/cm during contact bonding at 100° C. for 20 seconds. Still, the formation of the three layers by application methods requires a complex production process, while coating defects in separating layers can result in reduced storage stability.

As explained above, conventional epoxy resin compositions and conductive adhesive films formed using them have a large number of problems.

It is therefore an object of the present invention to overcome these problems by providing an epoxy resin composition suitable for adhesive materials used in the fields of electricity and electronics, such as conductive adhesive films, specifically an epoxy resin composition which provides enhancements and improvements in all of the following: (i) high-speed curing, (ii) heat and moisture resistance, (iii) shock resistance, (iv) storage stability and (v) low temperature curability.

It is another object of the invention to provide conductive adhesive films which employ the epoxy resin composition of the invention.

It is yet another object of the invention to provide a process for establishing electrical connections between conductors using conductive adhesive films according to the invention.

SUMMARY OF THE INVENTION

In one aspect thereof, the present invention provides a conductive epoxy resin composition which comprises the following components:

(a) an alicyclic epoxy resin, (b) a styrenic thermoplastic elastomer with epoxy groups in the molecule, (c) an ultraviolet-active cationic polymerization catalyst, (d) optionally, one or more diols, (e) optionally, a tackifier containing aromatic ring(s) in a molecule thereof, and (f) optionally, from about 1 to about 50 parts by weight based on 100 parts by weight of the alicyclic epoxy resin conductive particles.

In another aspect thereof, the present invention provides an anisotropically conductive adhesive film which comprises the conductive epoxy resin composition of the invention and has a thickness in the range of from about 10 to about 100 $\mu$m.

In still another aspect thereof, the present invention provides an electrical connecting method for establishing electrical connections between conductors provided on the surfaces of two different substrates, which method comprises arranging an anisotropically conductive adhesive film according to the invention so that it contacts with the conductor on the surface of the first substrate, subjecting the adhesive film on the first substrate to ultraviolet irradiation, arranging the second substrate so that its conductor contacts with the ultraviolet-irradiated adhesive film, and performing thermal contact bonding at a temperature in the range of from about 70 to about 120° C. to cause adhesion of the two substrates in a manner which provides continuity between their conductors.

The conductive epoxy adhesive resin composition of the invention is an ultraviolet-active thermosetting composition, and therefore, after ultraviolet irradiation, can be cured at a lower temperature than curing before irradiation.

The alicyclic epoxy resin which is the first component enhances the high-speed curability and low temperature curability of the resin composition. The combination of this component with the ultraviolet-active cationic polymerization catalyst (UV catalyst) allows low temperature high-speed curing and improves the storage stability.

The styrenic thermoplastic elastomer with epoxy groups in the molecule, (hereinafter sometimes referred to as "epoxy-containing styrenic elastomer") improves the post-curing impact resistance of the epoxy resin composition over a wide temperature range, alleviates residual stress produced internally by the curing reaction, and enhances the adhesion reliability. Because such an epoxy-containing styrenic elastomer does not react substantially with the resin composition during storage, thus allowing reaction between the epoxy resin and the any included diol upon heating after ultraviolet irradiation, there is no loss of storage stability. The curing of the epoxy resin composition occurs by crosslinking reaction between the three components, the alicyclic epoxy resin, the epoxy-containing styrenic elastomer and the diol, without requiring a polyaddition-type curing agent (for example, an amine compound). Furthermore, the crosslinked structure of the three components improves the heat and moisture resistance and the adhesion reliability of the cured product.

The diol accelerates the cationic polymerization while improving the compatibility between the epoxy resin and the epoxy-containing styrenic elastomer in the resin composition after curing, and improving the adhesion reliability. Suitable diols which may be used are diols with a fluorene skeleton in the molecule (hereinafter also referred to as "fluorene diols"), represented by the following formula (I):

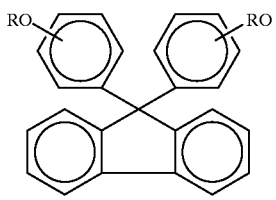

(I)

wherein R represents a hydrogen atom or —$C_xH_{2x}OH$ in which x is an integer of 1–5. Fluorene diols have satisfactory compatibility with epoxy resins and epoxy-containing styrenic elastomers, and give uniform compositions prior to curing to effectively prevent separation of the components during storage. In addition, since the fluorene skeleton is introduced into the crosslinked structure of the cured product, the heat and moisture resistance and adhesion reliability are also improved. Optional tackifiers may be incorporated into the composition in addition to, or in place of, the fluorene diols, in order to improve adhesion under high temperature and high humidity conditions. The tackifier component having an aromatic ring in the molecule is capable of increasing the mutual solubility of the epoxy resin and epoxy-containing styrenic elastomer in the resin composition after curing, and it thus increases reliability of adhesion. Furthermore, the above-mentioned tackifier undergoes partial dissolution in the alicyclic epoxy resin and the epoxy-containing styrenic elastomer (a crosslinking material) and is capable of increasing the adhesion of the epoxy resin composition after curing.

When used for making electrical as well as mechanical connections between items such as electronic circuit components, the epoxy resin composition of the invention also contains conductive particles in an amount of from about 1 to about 50 parts by weight based on 100 parts by weight of the alicyclic epoxy resin. The composition is then useful for forming anisotropic conductive adhesive films (conductive adhesive films). That is, it becomes possible to provide conductive adhesive films which can be cured at low temperature and high speed, and which allow establishment of reliable electrical connections between conductors on different substrates. Such conductive adhesive films, for example, can be used for electrical connections in microcircuits wherein the spacing between adjacent terminals is from about 10 to about 500 μm. The thermal contact bonding temperature for such films is normally in the range of from about 70 to about 150° C.

When the epoxy resin composition of the invention is used as a conductive adhesive film, the film thickness is usually in the range of from about 10 to about 100 μm. If the film thickness is less than about 10 μm there is a risk of lower reliability of the electrical connections and adhesion, whereas if it is greater than about 100 μm there is a risk of reduced low temperature curing and high-speed curing properties. From this standpoint, the film thickness is preferably in the range of from about 12 to about 80 μm, and more preferably from about 15 to about 50 μm.

The present invention further provides a method for reliable, low-temperature and high-speed establishment of electrical connections between conductors on the sides of two different substrates. Specifically, it is a method for establishing connections whereby an anisotropic conductive adhesive film according to the invention is arranged so as to contact with a conductor on one substrate (first substrate) and the adhesive film is then subjected to ultraviolet irradiation, after which another substrate (second substrate) is arranged so that its conductor contacts with the aforementioned adhesive film, and thermal contact bonding is accomplished at a temperature in the range of from about 70 to about 120° C. Thus, it becomes easier to produce at a relatively low temperature a laminate consisting of the two substrates and the anisotropic conductive adhesive layer situated between the two substrates which serves to attach both substrates together, so as to establish electrical connections between their conductors. According to this method it is possible to establish reliable electrical connections between conductors in plastic panels of the LCD and PET base materials of the FPC, without causing thermal damage.

DETAILED DESCRIPTION OF THE INVENTION

Preferred embodiments of the conductive epoxy resin composition, anisotropic conductive adhesive film and electrical connection method according to the present invention may be realized in the manner described below.

First, each of the components constituting the conductive epoxy resin composition will be explained.

Alicyclic epoxy resin

The alicyclic epoxy resin is a compound with at least 2 alicyclic epoxy groups in the molecule. Such alicyclic epoxy resins include, for example, vinylcyclohexene dioxide, 3,4-epoxycyclohexylmethyl-3,4-epoxycyclohexane carboxylate bis(3,4-epoxycyclohexyl) adipate and 2-(3,4-epoxycyclohexyl-5,5-spiro-3,4-epoxy)cyclohexene-m-dioxane. These epoxy resins may be used alone, or, if necessary, two or more epoxy resins may be used in combination.

The number of epoxy equivalents of the alicyclic epoxy resin used to carry out the invention is usually in the range of from about 50 to about 3000, and preferably from about 100 to about 1500. When the number of epoxy equivalents is less than about 50 there is a risk of reduced adhesion reliability, whereas at greater than about 3000 there is a risk of lower compatibility with the other components.

In particular, when used to form an adhesive film, the alicyclic epoxy resin is preferably one which is solid or has a viscosity of about 10,000 cps or greater at room temperature. Thus, when two or more epoxy resins are used, the overall viscosity is preferably at least about 10,000 cps. A glycidyl ether-type epoxy resin may also be used so long as it does not impede the effect of the invention.

Epoxy-containing, styrenic elastomer

The epoxy-containing styrenic elastomer is a copolymer including polystyrene units and at least one type of polymerization unit, and it is a polymer which has at least one epoxy group in the copolymer molecule and which has a Young's modulus in the range of from about 5 to about 1000 MPa. The polymerization unit used in combination with the polystyrene unit to form the copolymer is, for example, a polymerization unit derived from a monomer such as butadiene, isoprene, acrylonitrile, ethylene or propylene.

The epoxy group can be introduced into the molecule by polymerizing an epoxy-containing compound such as a glycidyl ether group or alicyclic epoxy group with a component which gives a styrenic elastomer. The number of epoxy equivalents in the elastomer is usually in the range of from about 200 to about 5000, preferably from about 300 to about 3000, and more preferably from about 500 to about 2500. If the number of epoxy equivalents of the elastomer is too high there is a reduced effect of improvement in the heat and moisture resistance and adhesion reliability of the cured composition, whereas if it is too low there is a risk of reduced peel adhesive strength.

The glass transition temperature of the styrenic elastomer is normally in the range of from about −60 to about 120° C. When the elastomer is a block copolymer wherein multiple glass transition temperatures are observed, all of those glass transition temperatures are preferably within the aforementioned range. The weight average molecular weight of the styrenic elastomer is usually in the range of from about 10,000 to about 1,000,000.

The styrenic elastomer may, if desired, be a mixture of two or more different types. A styrenic elastomer containing no epoxy groups may also be used so long as the effect of the invention is not impeded.

Diols

As already mentioned, a fluorene diol is preferred as the diol. Throughout the present specification, "fluorene diol" may be defined as a compound with a fluorene skeleton represented by formula (I) above and 2 or more hydroxyl groups in the molecule. Examples thereof include fluorene phenol-based compounds (compounds with bisphenol fluorene, biscresol fluorene, bisethylphenol fluorene, bisxylenol fluorene, etc. as the main skeleton).

As specific examples of diols suitable for use in addition to fluorene diols there may be mentioned alkylene diols and polyoxyalkylene diols, as described in U.S. Pat. No. 5,362,421, column 5.

A polyol with three or more hydroxyl groups in the molecule may also be used as the diol so long as it does not impede the effect of the invention.

Ultraviolet active cationic polymerization catalyst (UV catalyst)

The UV catalyst is a compound which produces cationic active species such as Lewis acids upon irradiation with ultraviolet light, to catalyze chain-opening reactions of epoxy rings. As specific examples of UV catalysts there may be mentioned organic metal complex salts comprising ligands such as cyclopentadienyl anion, indenyl anion, (xylene)hexafluoroantimonate anion or hexafluorophosphate anion and metal cations such as iron, chromium, molybdenum, tungsten, manganese, rhenium, ruthenium or osmium.

Tackifier

Tackifiers may be incorporated into the composition in addition to, or in place of, the fluorene diols, in order to improve adhesion under high temperature and high humidity conditions. A tackifier component having an aromatic ring in the molecule is capable of increasing the mutual solubility of the epoxy resin and epoxy-containing styrenic elastomer in the resin composition after curing and increases reliability of adhesion.

The above-mentioned tackifier undergoes partial dissolution in the cycloaliphatic epoxy resin and a crosslinking material consisting of an epoxy-containing styrenic elastomer and is capable of increasing the adhesion of the epoxy resin composition after curing. In this case, a tackifier having an aromatic ring (hereinafter referred to as "aromatic tackifier") refers to a resin made of an oligomer or polymer having at least one aromatic ring in the molecule.

In general, the weight average molecular weight of the above-mentioned oligomer or polymer is in the range of from about 100 to about 100,000. Furthermore, "a state of partial dissolution of the aromatic tackifier and crosslinked material" means a condition is observed in which microphase separation between the phase of the crosslinking material containing a part of the tackifier and the phase containing the remainder of the tackifier occurs. The point of difference is that the above-mentioned phase separation has a strong influence on the adhesion of the resin composition; thus, it is not desirable when a change in the phase structure occurs based on variations in the application conditions such as application temperature, etc. In a preferable embodiment of the present invention, as a result of the presence of the aromatic tackifier, destruction of the above-mentioned phase structure does not occur even when a relatively high application temperature is used and a reduction in adhesion hardly occurs. In other words, the epoxy resin composition of the present invention containing an aromatic tackifier is capable of bonding two substrates with a strong adhesive force in a short time (10–30 seconds, for example) over a wide range of temperatures in the range of from about 70 to about 150° C., and is thereby capable of increasing the reliability of electrical connections of conductive circuits on each substrate.

The aromatic tackifier can be selected from tackifiers commonly used in the field of adhesives. In specific terms, terpene phenol copolymers and coumarone-indene resins can be mentioned as suitable examples. Similarly, styrene-modified phenol resins, alkyl phenol resins, aromatic petroleum resins, etc. can be used. Furthermore, in the case of compounds having hydroxyl groups in the molecule as in the case of terpene phenol copolymers, crosslinking among the cycloaliphatic epoxy resin, the epoxy-containing styrenic elastomer and the tackifier occurs, and the above-mentioned crosslinked structure increases the heat resistance, moisture resistance and adhesion reliability of the cured material. When the above-mentioned tackifier compounds are used, an increase in adhesion and adhesion reliability can be achieved over the above-mentioned wide range of application temperatures.

The aromatic tackifier can be used independently or in the form of a mixture of two different types of tackifiers. Furthermore, in addition to an aromatic tackifier, an appropriate amount of a tackifier without an aromatic ring can be used in combination. Examples of tackifiers without an aromatic ring include rosin compounds such as rosin, rosin ester and hydrogenated rosin, aliphatic petroleum resins, and the like.

The conductive epoxy resin composition of the invention can usually be prepared by first making an epoxy resin composition by combination of the aforementioned components and other additives if necessary, and then dispersing conductive particles in the composition.

Epoxy resin composition

The mixing ratios of each of the components for preparation of the epoxy resin composition may be appropriately determined so as to bring out the effect of the invention. Normally, the mixing ratios for the diols (fluorene diol, etc.), epoxy-containing styrenic elastomer and UV catalyst are in the following ranges:

epoxy-containing styrenic elastomer: from about 10 to about 500 parts by weight diols: from 0 to about 50 parts by weight UV catalyst: from about 0.1 to about 5 parts by weight aromatic tackifier: from 0 to about 200 parts by weight with respect to 100 parts by weight of the alicyclic epoxy resin.

The mixing ratios may be determined as appropriate, depending on whether the epoxy resin composition is to be used directly in liquid form or in the form of a film. For example, if the resin composition is to be used as a film, the components are combined in proportions in the following ranges:

epoxy-containing styrenic elastomer: from about 60 to about 200 parts by weight, preferably from about 100 to about 150 parts by weight diols: from about 5 to about 20 parts by weight, preferably from about 10 to about 15 parts by weight UV catalyst: from about 0.5 to about 3 parts by weight, preferably from about 1 to about 2 parts by weight aromatic tackifier: from about 5 to about 150 parts by weight, preferably from about 10 to about 100 parts by weight with respect to 100 parts by weight of the alicyclic epoxy resin. In the above mentioned mixing ratio, the proportion of the diol can be ZERO when the diol is not essential. On the other hand, the proportion of the aromatic tackifier can be ZERO when the tackifier is not essential. These mixing ratios allow the films to be kept at room temperature, and give compositions with rheological characteristics exhibiting proper melt viscosity (for example, 50,000–200,000 cps) during thermal contact bonding.

The above-mentioned mixing ratios also apply when using a mixed diol comprising only a diol other than a fluorene diol or a fluorene diol with another type of diol.

Conductive epoxy resin composition

The conductive epoxy resin composition is usually prepared by dispersing conductive particles in the aforementioned epoxy resin composition. However, the dispersion of the conductive particles may, if necessary, be carried out at any desired stage during preparation of the epoxy resin composition.

Conductive adhesive film

The conductive adhesive film is formed by dispersing the conductive particles in the epoxy resin composition and then making a film from the dispersion. The amount of conductive particles added is usually in the range of from about 1 to about 50 parts by weight, preferably from about 4 to about 30 parts by weight and more preferably from about 5 to about 10 parts by weight, with respect to 100 parts by weight of the epoxy resin. If the amount of conductive particles is too low there is a risk of reduced conductivity, whereas if it is too high there is a risk of reduced conductive anisotropy.

Conductive particles which may be advantageously used to carry out the present invention include, for example, metal particles such as nickel, gold or solder, or particles prepared by providing a conductive coating on the surface particles of a non-conductive substance such as a polymer. Such particles may be used alone or in different combinations.

In addition, for satisfactory dispersability of the conductive particles, a coupling agent, such as a silane coupling agent, may also be combined therewith. The mixing ratio for the silane coupling agent is usually in the range of from about 1 to about 10 parts by weight and preferably from about 2 to about 7 parts by weight to 100 parts by weight of the epoxy resin. The thickness of the conductive adhesive film is generally in the range of from about 10 to about 100 μm. A method for preparing the conductive adhesive film will be explained below.

Other additives

A cationic polymerization reaction accelerator may also be added with the other components during preparation of the epoxy resin composition of the invention. Addition of a reaction accelerator gives further improvement in the low temperature and high-speed curability. The reaction accelerator may be, for example, di-tert-butyl oxalate. The mixing ratio for the reaction accelerator is usually in the range of from about 0.1 to about 5 parts by weight, preferably from about 0.5 to about 3 parts by weight and more preferably from about 1 to about 2 parts by weight, with respect to 100 parts by weight of the alicyclic epoxy resin.

Other additives, such as coloring agents, light stabilizers, antioxidants, surfactants, thickening agents, foaming agents, antifungal agents, corrosion inhibitors, inorganic fillers, plasticizing agents, humectants, absorbers, rubber particles, and thermoplastic resins and tackifiers may also be added in amounts which do not impair the effect of the invention. Suitable tackifiers which may be used include rosin, rosin ester, hydrogenated rosin, cumarone-indene resin and polyterpene.

Production method of adhesive films

The adhesive films are produced by preparing a coating solution containing the aforementioned epoxy resin composition, and coating it onto a support such as a polymer film to make a coated film.

The coating solution containing the epoxy composition may be prepared by introducing all of the aforementioned components into a mixing apparatus either simultaneously or separately, and then stirring and kneading them to make a uniform solution or dispersion. The mixing apparatus may be, for example, a high-speed mixer, kneader, homomixer or planetary mixer. A solvent may also be added to the coating solution if necessary. The coating apparatus used may be a knife coater, bar coater, roll coater, die coater, etc.

Electrical connection method between conductors

A method will now be described for establishing electrical connections between conductors provided on the surfaces of two different substrates (the first and second substrates), using a conductive adhesive film according to the invention.

First, the conductive adhesive film is placed so that it contacts with the conductor on one of the substrates (first substrate), and the adhesive film is subjected to ultraviolet irradiation. This step is convenient for temporarily fixing the substrate and the adhesive film when the surface of the uncured conductive adhesive film is adhesive. When one surface of the adhesive film is covered with a transparent support, ultraviolet light is irradiated onto the adhesive film through the support. When the support is one which absorbs ultraviolet rays, the ultraviolet light is irradiated after peeling off the support. The ultraviolet irradiation is usually performed using a high pressure mercury lamp, and the intensity is usually adjusted to be 100–10,000 mJ/cm$^2$ (cumulative at 360 nm).

Next, the (second substrate) is placed in contact with the adhesive film whose conductor has been activated, and thermal contact bonding is carried out at a temperature of 120° C. or below (for example, in a range of from about 70 to about 120° C.). The open time from activation until thermal contact bonding is usually from a few seconds to 24 hours. The thermal contact bonding may be accomplished with an iron, hot damper or heated roll. The pressure strength may be appropriately selected so as to achieve adequate electrical continuity after connection. A suitable pressure is normally in the range of from about 10 to about 50 kg/cm$^2$. Also, the contact bonding time is sufficient at 10–30 seconds as mentioned above, but there is no adverse effect on the adhesive performance even with a contact bonding time of one minute or longer.

EXAMPLES

The present invention will now be explained in more detail by way of the following examples. It is to be understood, however, that the invention is in no way limited to these examples.

Example 1

(1) Preparation of epoxy resin composition

An epoxy resin composition for forming an anisotropic conductive adhesive film was prepared according to the following procedure.

A uniform resin solution was obtained by dissolving 8.0 g of the liquid polyfunctional alicyclic epoxy resin "Epilode GT-401", tradename of Daicel Chemical Industries, KK. (epoxy equivalents: 219, viscosity=approx. 2,000 centipoise measured at 70° C.), 1.0 g of the fluorene diol "BPHE", tradename of Shinnittetsu Chemicals, KK. (chemical name: ethanol, 2,2'-[9H-fluorene-9-ylidenebis(4,1-phenyleneoxy) bis-) and 11.0 g of the epoxy-modified styrenic thermoplastic elastomer "Epoblend A 1005", tradename of Daicel Chemical Industries, KK. (epoxy equivalents: approx. 1950) into 20.0 g of tetrahydrofuran (THF). To the resulting solution there was added 0.6 g of conductive particles "Bright20 GNR4.6-EH", tradename of Nihon Chemical Industries, KK. (gold-plated polymer particles), and stirring produced a uniform dispersion.

Separately, 0.12 g of cyclopentadienyl iron(II) (xylene) hexafluoroantimonate (CpFeXy) as an ultraviolet-active cationic polymerization catalyst, 0.12 g of di-tert-butyloxalate (t-Box) as a cationic polymerization accelerator and 0.4 g of γ-glycidoxypropyl trimethoxysilane A187, tradename of Unika, KK. as a silane coupling agent were dissolved in 1.2 g of methyl ethyl ketone (MEK) to obtain a uniform mixed solution. The resulting solution was added to the dispersion prepared in the manner described above and stirred to prepare an epoxy resin composition as a uniform dispersion.

(2) Formation of anisotropic conductive adhesive film

The epoxy resin composition prepared in the manner described above was dropped onto a 38 μm-thick PET film which had been subjected to silicone-peel treatment, and a film was made using a knife coater. After making the film, it was dried in an oven at 60° C. for 10 minutes to form an anisotropic conductive adhesive film. The post-drying thickness of the conductive adhesive film was 21 μm.

(3) Connection between conductors using anisotropic conductive adhesive film

Conductive glass (surface resistance=20 Ω/square) coated with ITO (indium-tin oxide) and an FPC were adhered and electrically connected according to the following procedure to provide continuity between them.

First, the anisotropic conductive adhesive film prepared in the manner described above was temporarily adhered to the surface of the aforementioned conductive glass under conditions of 80° C. temperature, 1 kg/cm² pressure and a 4 second contact bonding time, after which the PET film was removed and the conductive adhesive film was exposed to ultraviolet irradiation. The ultraviolet irradiation was performed using a high pressure mercury lamp, and the intensity was adjusted to about 2,200 mJ/cm² (cumulative at 360 nm). About 30 seconds after the ultraviolet irradiation, the terminal side of the FPC (Sn-plated Cu/polyimide film laminate; number of terminals=63; pitch width 100 μm) was placed against the surface of the conductive adhesive film and contact bonded under conditions of 100° C. —30 kg/cm²—20 seconds, to complete connection between the conductive glass and the FPC. The length of the connections between conductors in the resulting connection circuit was 19 mm, and the connection width was 2 mm.

(4) Test of connection circuit

The connection circuit prepared in step (3) above was used for a resistance test to measure the resistance value and a peel test to evaluate the adhesive strength, in the following manner.

For the resistance test, the 3-terminal method was used to measure resistance values for all of the terminals, and the average value of the resistance values for all the terminals were evaluated as excellent (⊚) for ≦1 Ω, good (○) for >1 Ω and ≦5 Ω, acceptable (Δ) for >5 Ω and ≦10 Ω and unacceptable (x) in the case of even one terminal without continuity (open terminal), irrespective of the average value.

For the peel test, a tension tester was used for a 90° peel strength test at a peel rate of 50 mm/min. The average value for the peel strengths of 4 samples was determined and evaluated as excellent (⊚) for ≧700 g/cm, good (○) for <700 g/cm and ≧600 g/cm, acceptable (Δ) for <600 g/cm and ≧500 g/cm and unacceptable (x) for less than 500 g/cm.

The results obtained by these tests are shown in Table 1 below. The results of these tests demonstrated that the conductive adhesive film of this example had superior low temperature and high-speed curability, and exhibited high adhesion reliability. For reference, Table 1 also shows the types and amounts of materials used to form the anisotropic conductive adhesive films.

(5) Evaluation of reactivity

The reactivity of the conductive adhesive film formed in step (2) above was evaluated based on the exothermic peak temperature measured using a differential scanning calorimeter (DSC). The exothermic peak temperature (° C.) is considered to be the curing temperature. The measurement was made on the samples prior to ultraviolet (UV) irradiation and about 5 minutes after UV irradiation. The test results are shown in Table 1 below. The conductive adhesive film of this example was judged to have a curing temperature of about 80° C. after ultraviolet irradiation. The measurement was made with a temperature elevating rate of 10° C./min.

(6) Room temperature storage stability test

The conductive adhesive film formed in step (2) above was kept at 25° C./50% RH for 4 weeks, after which steps (3) and (4) were repeated and the values measured for the adhesive strength and resistance were compared against the initial values. The test results are shown in Table 2. The conductive adhesive film of this example was judged to have maintained its initial performance even after storage.

(7) Heat and moisture resistance test

The procedure of step (3) was repeated to prepare a sample. After keeping the sample at 85° C./85% RH for 500 hours, the procedure of step (4) was repeated and the values measured for the adhesive strength and resistance were compared against the initial values. The test results are shown in Table 3 below. The conductive adhesive film of this example was judged to have maintained a sufficient usable level of performance even after storage.

Examples 2–9

The procedure described in Example 1 was repeated. However, in these examples the types and amounts of the alicyclic epoxy resin used, as well as the types and amounts of the epoxy-modified styrenic thermoplastic elastomer, were changed to those listed in Table 1. In Table 1, the abbreviations used in the composition column stand for the following substances.

EPHE3150—tradename for alicyclic epoxy resin, product of Daicel Chemical Industries, KK.; epoxy equivalents: approx. 185; solid at room temperature; melting point: 85° C.

A1010—epoxy-modified styrenic thermoplastic elastomer, tradename Epoblend Al1010, product of Daicel Chemical Industries, KK.; epoxy equivalents: approx. 1000

A1020—epoxy-modified styrenic thermoplastic elastomer, tradename Epoblend A1020, product of Daicel Chemical Industries, KK.; epoxy equivalents: 510

Evaluation of the conductive adhesive films of these examples was made in the same manner as Example 1. The evaluation results are given in Tables 1 to 3.

Comparative Example 1

The procedures of steps (1) to (5) of Example 1 were repeated. However, for comparison in this example, an equivalent amount of the styrenic thermoplastic elastomer Clayton FG1901X (tradename of Shell, KK.) modified with maleic anhydride as a functional group which can react with epoxy resins was used instead of the epoxy-modified styrenic thermoplastic elastomer Epoblend A1005 (tradename). Refer to Table 1 for listing of the composition.

The evaluation results are given in Table 1. In this example, the adhesive strength between the conductive glass and FPC was low, and continuity could not be achieved for all of the terminals of the connection circuit which was tested.

Comparative Example 2

The procedures of steps (1) to (5) of Example 1 were repeated. However, for comparison in this example, the fluorene diol BPHE (tradename) was not used, and the amount of the epoxy-modified styrenic thermoplastic elastomer Epoblend A1005 (tradename) was increased from 11.0 g to 12.0 g. Refer to Table 1 for listing of the composition.

The evaluation results are given in Table 1. In this example as well, the adhesive strength between the conductive glass and FPC was low, and open terminals with no continuity were produced.

TABLE 1

| Composition | Ex. 1 | Ex. 2 | Ex. 3 | Ex. 4 | Ex. 5 | Ex. 6 | Ex. 7 | Ex. 8 | Ex. 9 | Ex. C1 | Ex. C2 |
|---|---|---|---|---|---|---|---|---|---|---|---|
| Gt401 | 8.0 | 9.0 | 8.0 | 9.0 | 8.0 | 9.0 | 7.0 | 8.0 | 7.0 | 8.0 | 8.0 |
| EPHE3150 | | | | | | | 1.0 | 1.0 | 2.0 | | |
| BPHE | 1.0 | 1.0 | 1.0 | 1.0 | 2.0 | 1.0 | 1.0 | 1.0 | 1.0 | 1.0 | |
| A1005 | 11.0 | 10.0 | | | | | | | | | 12.0 |
| A1010 | | | 11.0 | 10.0 | 10.0 | | 11.0 | 10.0 | 10.0 | | |
| A1020 | | | | | | 10.0 | | | | | |
| FG1901X | | | | | | | | | | 11.0 | |
| CpFeXy | 0.12 | 0.12 | 0.12 | 0.12 | 0.12 | 0.12 | 0.12 | 0.12 | 0.12 | 0.12 | 0.12 |
| t-Box | 0.12 | 0.12 | 0.12 | 0.12 | 0.12 | 0.12 | 0.12 | 0.12 | 0.12 | 0.12 | 0.12 |
| A187 | 0.40 | 0.40 | 0.40 | 0.40 | 0.40 | 0.40 | 0.40 | 0.40 | 0.40 | 0.40 | 0.40 |
| Adhesive strength | Δ | Δ | ⊚ | Δ | ○ | Δ | ⊚ | ⊚ | ○ | x | Δ |
| Resistance | ○ | ⊚ | ○ | ⊚ | ○ | ⊚ | ⊚ | ⊚ | ○ | x | x |
| Reactivity (° C.) no irradiation | 221 | 221 | 193 | 196 | 194 | 194 | 194 | 193 | 225 | 186 | 200 |
| UV exposed | 81 | 83 | 83 | 83 | 66 | 67 | 83 | 83 | 68 | 83 | 85 |

*Amounts given in grams

TABLE 2

| | Ex. 1 | Ex. 2 | Ex. 3 | Ex. 4 | Ex. 5 | Ex. 6 | Ex. 7 | Ex. 8 | Ex. 9 |
|---|---|---|---|---|---|---|---|---|---|
| Adhesive Strength | | | | | | | | | |
| initial | Δ | Δ | ⊚ | Δ | ○ | Δ | ⊚ | ⊚ | ○ |
| 4 weeks | ⊚ | ○ | ⊚ | Δ | ⊚ | Δ | ⊚ | ⊚ | ○ |
| Resistance | | | | | | | | | |
| initial | ○ | ⊚ | ○ | ⊚ | ○ | ⊚ | ⊚ | ⊚ | ○ |
| 4 weeks | ○ | ⊚ | ⊚ | ⊚ | ⊚ | ⊚ | ⊚ | ⊚ | ⊚ |

TABLE 3

| | Ex. 1 | Ex. 2 | Ex. 3 | Ex. 4 | Ex. 5 | Ex. 6 | Ex. 7 | Ex. 8 | Ex. 9 |
|---|---|---|---|---|---|---|---|---|---|
| Adhesive Strength | | | | | | | | | |
| initial | Δ | Δ | ⊚ | Δ | ○ | Δ | ⊚ | ⊚ | ○ |
| 500 hours | Δ | ○ | ○ | Δ | ○ | ○ | ⊚ | ⊚ | Δ |
| Resistance | | | | | | | | | |
| initial | ○ | ⊚ | ○ | ⊚ | ○ | ⊚ | ⊚ | ⊚ | ○ |
| 500 hours | Δ | ○ | ○ | ○ | Δ | ○ | ○ | Δ | ○ |

Example 10

(1) Production of epoxy resin composition

The epoxy resin composition used for production of the anisotropically conductive adhesive film, namely, an epoxy adhesive solution, was produced according to the procedure described below, which is very similar to the procedure for Example 1 above.

8.0 g of liquid polyfunctional cycloaliphatic epoxy resin "Epolide GT-401 (product name), product of Daicel Corp. (Ltd.), epoxy equivalent of 219, viscosity of approximately 2,000 cp (measured value at 70° C.)", 10.0 g of epoxy-modified styrenic thermoplastic elastomer "Epofriend A1010 (product name), product of Daicel Corp. (Ltd.), epoxy equivalent of approximately 1000" and 2.0 g of terpene-phenol copolymer "YS Polystar S145 (product name), product of Yasuhara Yushi Chemical Ind. (Ltd.), aromatic tackifier" were dissolved in 40.0 g of tetrahydrofuran (THF) and uniform mixing was subsequently performed. Subsequently, 0.6 g of conductive particles "Bright 20 GNR4.6-EH (product name), product of Japan Chemical Ind. (Ltd.), gold-plated polymer particles" were added to the uniform solution produced above and further stirring was performed. As a result, a uniformly-dispersed dispersion of the, conductive particles was produced.

Meanwhile, 0.12 g of cyclopentadenyl iron (II) (xylene) hexafluoroantimonate (CpFeXy), used as a ultraviolet activating type cationic polymerization reaction catalyst, 0.12 g of di-tert-butyl oxalate (t-Box), used as a cationic polymerization reaction accelerator, and 0.4 g of gamma-glycydoxy propyl trimethoxy silane "A187 (product name), product of Unicar Corp. (Ltd.)", used as silane coupling agent were dissolved in 1.2 g of methyl ethyl ketone (MEK) to produce a uniform solution. The solution produced was added to the dispersion produced above and further stirring was performed. As a result, an epoxy resin composition consisting of a uniform dispersion was produced.

(2) Production of anisotropic conductive adhesive film

The epoxy resin composition produced as described above was applied to a polyethylene terephthalate (PET) film with a thickness of 38 μm and that had been provided with a silicone release treatment and film coating was done using a hand coater. After film formation, drying was performed at 60° C. for 10 minutes in an oven. As a result, an anisotropic conductive adhesive film with a film thickness of 21 μm was produced.

(3) Production of test piece

Bonding was performed for a conductive glass coated with an ITO (indium-tin oxide) (hereinafter referred to as "ITO glass", surface resistance of 20 Ω/square) and an FPC according to the procedure described below and to produce a test piece made of a connection circuit wherein the two are electrically connected and was used for the evaluation tests shown below.

First, temporary tack was performed for the anisotropic conductive adhesive film produced in process (2) above on the surface of an ITO glass under conditions consisting of a temperature of 80° C., pressure of 1 kg/cm², and application time of 4 seconds. Subsequently, the PET film was removed from the conductive adhesive film and ultraviolet was applied to the conductive adhesive film that remained. In this case, a high-pressure mercury lamp was used and an adjustment was made to produce an exposure of approximately 2,200 mJ/cm² (product at 360 nm) can be achieved. Approximately 30 seconds after the ultraviolet application, the FPC (Sn-plated Cu/polyimide film laminate, number of terminals=63 terminals, pitch width=100 μm) was applied to the surface of the conductive adhesive film with the end-face facing said surface and the application was carried out under the two conditions shown below.

Condition 1 . . . 100° C.—30 kg/cm²—20 sec
Condition 2 . . . 140° C.—30 kg/cm²—20 sec
Connection between the ITO glass and FPC was completed and the target test piece (connection circuit) was produced.

In the connection circuit produced above, the connection length between conductors was 19 mm and the connection width was 2 mm.

(4) Evaluation of adhesive force and resistance

In order to evaluate the adhesive force and resistance of the test piece produced in the process (3) above, a peel test and resistance test were performed as shown below.

Peel test

The test piece was installed in a tensile tester and the 90-degree peel strength was measured at a peel speed of 50 mm/min. The mean value was obtained from the 90-degree peel strength of each four test pieces and an evaluation was made of the adhesive force based on the criteria below.

| 90-degree peel test (mean value) | Evaluation of adhesion |
|---|---|
| 600 g/cm or higher | Very good (◎) |
| 500 g/cm to 600 g/cm | Good (○) |
| 400 g/cm to 500 g/cm | Adequate (Δ) |
| 400 g/cm or lower | Poor (x) |

Resistance test

The test piece was set up for measurement with a multimeter and the resistance was measured at a total of (63) terminals according to the three terminal method. An evaluation was performed for the resistance based on the standard shown below.

| Resistance (mean value) | Evaluation of resistance |
|---|---|
| 1 Ω or below | Very good (◎) |
| 1 Ω to 5 Ω | Good (○) |
| 5 Ω to 10 Ω | Adequate (Δ) |
| Open terminals exist | Poor (x) (conduction absent) |

The results obtained from above-mentioned tests are shown in the Table 4. As shown in Table 4, the anisotropically conductive adhesive film of the application example exhibits excellent low-temperature curability and rapid curability as well as a high adhesion reliability. Furthermore, different materials and the amount of material used for production of anisotropically conductive adhesive films are listed for reference.

(5) Evaluation of reactivity

An evaluation was performed for the reactivity of the conductive adhesive film produced in process (2) above based on the exoergic peak temperature (° C.). The exoergic peak temperature is regarded as the curable temperature and in this case, measurement was performed at a temperature increase rate of 10° C./min. The test was carried out two times: before application of ultraviolet (UV) (before UV application) and approximately 5 minutes after application of UV (after UV application). The test results obtained are shown in Table 4. It was found that in the case of the conductive adhesive film of the application example, curing can be achieved at approximately 90° C. after ultraviolet was applied.

(6) Heat resistance and moisture resistance test

Process (3) above was repeated and condition 1 was used as the application condition to produce a test piece. Each test piece was stored under high temperature and high humidity conditions of 85° C./85% RH (relative humidity) for 500 hours and the above process (4) was repeated. The adhesion and the value of resistance obtained in this case were compared with the values obtained initially. The results obtained are shown in Table 5. It was found that an adequate level of performance can be maintained in the conductive adhesive film of the application example even after storage under high temperature and high humidity conditions.

Examples 11–16

The procedure described in Example 10 above was repeated. In this case, changes were made in the mixing ratio of the cycloaliphatic epoxy resin, aromatic tackifier, and epoxy-containing styrenic elastomer in Examples 11–14 and the type of aromatic tackifiers used was changed in Examples 15 and 16 as shown in Table 4 below.

YP-90 . . . Terpene-phenol copolymer YP-90 (product name), product of Yasuhara Yushi Chemical Ind. (Ltd.)

N100S . . . Coumarone-indene resin . . . Eskron N100S (product name), product of Shinnittetsu Chemical Co.

An evaluation of the conductive adhesive films of each application example was carried out as in the case of Example 10 above. The evaluation results obtained are shown in Table 4 and Table 5.

Examples 17–20

The procedure described in Example 10 was repeated. In this case, changes were made in the mixing ratio of the cycloaliphatic epoxy resin, aromatic tackifier, and epoxy-containing styrenic elastomer and (or) the polyol shown below also was included as an additional component (Examples 17–19), and the type of aromatic tackifier used was changed (Example 20). It should be noted that codes used in Table 4 are defined below.

EPHE . . . Ethanol, 2,2'-[9H-fluorene-9-iridene bis(4,1-phenylene oxy)]bis, BPHE (product name), the fluorene diol produced by Shinnittetsu Chemical Co. (Ltd.)

1,7-HpDO . . . 1,7-heptane diol 1,4-CHDM . . . 1,4-cyclohexane dimethanol

T145 . . . Terpene-phenol copolymer T145 (product name), product of Yasuhara Yushi Chemical Ind. (Ltd.)

An evaluation was performed for the conductive adhesive films of each example as in the case of Example 10. The evaluation results obtained are shown in Table 4 and Table 5 below.

Comparative Example 3

Process steps (1)–(5) described in Example 10 above were repeated. In this case, use of aromatic tackifier was omitted, and the amount of epoxy-containing styrenic elastomer, Epo-friend A1005 (product name) was increased and polyol and BPHE (product name) also were added [for reference, see the composition shown in Table 4].

The evaluation results obtained are shown in Table 4 below. In this case, adhesion between the conductive glass and FPC was inadequate and the resistance was slightly poor.

TABLE 4

| Composition | Ex. 10 | Ex. 11 | Ex. 12 | Ex. 13 | Ex. 14 | Ex. 15 | Ex. 16 | Ex. 17 | Ex. 18 | Ex. 19 | Ex. 20 | Ex. C3 |
|---|---|---|---|---|---|---|---|---|---|---|---|---|
| GT-401 | 8.0 | 8.0 | 8.0 | 9.0 | 9.0 | 8.0 | 8.0 | 8.0 | 7.76 | 7.74 | 8.0 | 8.0 |
| BPHE | | | | | | | | | 1.0 | | | |
| 1,7-HpDO | | | | | | | | | | 0.24 | | |
| 1,4-CHDM | | | | | | | | | | | 0.26 | |
| S145 | 2.0 | 4.0 | 5.0 | 6.0 | 5.5 | | | 5.5 | 4.0 | 4.0 | | |
| YP-90 | | | | | | 1.0 | | | | | | |
| N100S | | | | | | | 6.0 | | | | | |
| T145 | | | | | | | | | | | 6.0 | |
| A1010 | 10.0 | 8.0 | 7.0 | 6.0 | 5.5 | 11.0 | 6.0 | 5.5 | 8.0 | 8.0 | 8.0 | 12.0 |
| CpFeXy | 0.12 | 0.12 | 0.12 | 0.12 | 0.12 | 0.12 | 0.12 | 0.12 | 0.12 | 0.12 | 0.12 | 0.12 |
| t-Box | 0.12 | 0.12 | 0.12 | 0.12 | 0.12 | 0.12 | 0.12 | 0.12 | 0.12 | 0.12 | 0.12 | 0.12 |
| A187 | 0.40 | 0.40 | 0.40 | 0.40 | 0.40 | 0.40 | 0.40 | 0.40 | 0.40 | 0.40 | 0.40 | 0.40 |
| 100° C. Adhesive strength | ⊚ | ⊚ | ○ | ⊚ | ⊚ | ○ | ○ | ○ | Δ | ○ | ⊚ | x |
| 100° C. Resistance | ⊚ | ⊚ | ⊚ | ⊚ | ⊚ | ⊚ | ⊚ | ⊚ | ⊚ | ⊚ | ⊚ | ○ |
| 140° C. Adhesive strength | Δ | ⊚ | ⊚ | ⊚ | ○ | Δ | ⊚ | ⊚ | ⊚ | ⊚ | ○ | x |
| 140° C. Resistance | ○ | ⊚ | ⊚ | ⊚ | ⊚ | ○ | ⊚ | ⊚ | ⊚ | ⊚ | ⊚ | ○ |
| Reactivity (° C.) | | | | | | | | | | | | |
| no irradiation | 191 | 190 | 191 | 188 | 191 | 179 | 199 | 187 | 192 | 192 | 190 | 191 |
| UV exposed | 90 | 92 | 95 | 94 | 92 | 92 | 91 | 65 | 58 | 60 | 90 | 86 |

*Amounts given in grams

TABLE 5

| | Ex. 10 | Ex. 11 | Ex. 12 | Ex. 13 | Ex. 14 | Ex. 15 | Ex. 16 | Ex. 17 | Ex. 18 | Ex. 19 | Ex. 20 |
|---|---|---|---|---|---|---|---|---|---|---|---|
| Adhesive Strength | | | | | | | | | | | |
| initial | ⊚ | ⊚ | ○ | ⊚ | ⊚ | ○ | ○ | ○ | Δ | ○ | ⊚ |
| 500 hours | ⊚ | ⊚ | ⊚ | ⊚ | ⊚ | ○ | ○ | ○ | ○ | ○ | ⊚ |
| Resistance | | | | | | | | | | | |
| initial | ⊚ | ⊚ | ⊚ | ⊚ | ⊚ | ⊚ | ⊚ | ⊚ | ⊚ | ⊚ | ⊚ |
| 500 hours | ⊚ | ⊚ | ⊚ | ⊚ | ⊚ | ⊚ | ⊚ | ⊚ | ⊚ | ⊚ | ○ |

What is claimed is:

1. An epoxy resin composition comprising the following components:
   (a) an alicyclic epoxy resin,
   (b) a styrenic thermoplastic elastomer with at least one epoxy group therein,
   (c) an ultraviolet-active cationic polymerization catalyst, and
   (d) a diol containing at least two hydroxyl groups therein, wherein the diol contains a fluorene moiety therein.

2. An epoxy resin composition comprising the following components:
   (a) an alicyclic epoxy resin,
   (b) a styrenic thermoplastic elastomer with at least one epoxy group therein,
   (c) an ultraviolet-active cationic polymerization catalyst, and
   (d) conductive particles.

3. The epoxy resin composition of claim 2 which further comprises a diol containing at least two hydroxyl groups therein.

4. An epoxy resin composition as in claim 2, which further comprises a tackifier containing aromatic ring(s) therein.

5. An epoxy resin composition as in claim 3, wherein the diol contains a fluorene moiety therein.

6. An anisotropically conductive adhesive film which comprises an epoxy resin composition according to claim 2 and has a thickness in the range of 10 to 100 μm.

7. An electrical connecting method for establishing electrical connections between two different substrates, a first substrate and a second substrate, each substrate having a surface with conductors provided thereon, which method comprises arranging an anisotropically conductive adhesive film according to claim 6 so that it contacts with the conductor on the surface of the first substrate,
   subjecting the adhesive film on said first substrate to ultraviolet irradiation to form a UV-irradiated adhesive film,
   arranging the second substrate so that a conductor thereon contacts with said UV-irradiated adhesive film, and
   performing thermal contact bonding at a temperature in the range of 70 to 150° C. to cause adhesion of the two substrates in a manner which provides continuity between their conductors.

8. An electrical connecting method for establishing electrical connections according to claim 7 wherein the thermal contact bonding step is accomplished in less than about 1 minute.

9. An epoxy resin composition comprising the following components:
   (a) an alicyclic epoxy resin,
   (b) a styrenic thermoplastic elastomer with at least one epoxy group therein,
   (c) an ultraviolet-active cationic polymerization catalyst, and
   (d) conductive particles in the amount of 1 to 50 parts by weight based on 100 parts by weight of said alicyclic epoxy.

10. The epoxy resin composition of claim 9 which further comprises a diol containing at least two hydroxyl groups therein.

11. An epoxy resin composition as in claim 10, wherein the diol contains a fluorene moiety therein.

12. An epoxy resin composition as in claim 9, which further comprises a tackifier containing aromatic ring(s) therein.

13. An anisotropically conductive adhesive film which comprises an epoxy resin composition according to claim 9 and has a thickness in the range of 10 to 100 μm.

14. An electrical connecting method for establishing electrical connections between two different substrates, a first substrate and a second substrate, each substrate having a surface with conductors provided thereon, which method comprises arranging an anisotropically conductive adhesive film according to claim 6 so that it contacts with the conductor on the surface of the first substrate,
   subjecting the adhesive film on said first substrate to ultraviolet irradiation to form a UV-irradiated adhesive film,
   arranging the second substrate so that a conductor thereon contacts with said UV-irradiated adhesive film, and
   performing thermal contact bonding at a temperature in the range of 70 to 150° C. to cause adhesion of the two substrates in a manner which provides continuity between their conductors.

15. An electrical connecting method for establishing electrical connections according to claim 14 wherein the thermal contact bonding step is accomplished in less than about 1 minute.

* * * * *

UNITED STATES PATENT AND TRADEMARK OFFICE
CERTIFICATE OF CORRECTION

PATENT NO. : 6,309,502 B1
DATED : October 30, 2001
INVENTOR(S) : Yuji Hiroshige and Koji Itoh It is certified that error appears in the above-identified patent and that said Letters Patent is hereby corrected as shown below:

<u>Column 1,</u>
Lines 28-29, delete "No. 49-20 25039" and insert in place thereof -- No. 49-25039 --

<u>Column 11,</u>
Line 51, delete "pitch width 100 µm" and insert in place thereof -- pitch width = 100 µm --

<u>Column 13,</u>
Line 34, delete "A11010" and insert in place thereof -- A1010 --

<u>Column 14,</u>
TABLE 1, line 1, column 1, delete "Gt401" and insert in place thereof -- GT401 --

Signed and Sealed this

Seventh Day of January, 2003

JAMES E. ROGAN
*Director of the United States Patent and Trademark Office*